(12) United States Patent
Naem

(10) Patent No.: US 6,853,017 B2
(45) Date of Patent: Feb. 8, 2005

(54) BIPOLAR TRANSISTOR STRUCTURE WITH ULTRA SMALL POLYSILICON EMITTER

(75) Inventor: Abdalla Aly Naem, Overijse (BE)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/120,926

(22) Filed: Apr. 11, 2002

(65) Prior Publication Data

US 2002/0192916 A1 Dec. 19, 2002

Related U.S. Application Data

(62) Division of application No. 09/881,904, filed on Jun. 15, 2001, now Pat. No. 6,399,455.

(51) Int. Cl.$^7$ .................................... H01L 31/0328
(52) U.S. Cl. .................. 257/197; 257/511; 257/517; 257/525; 257/565
(58) Field of Search .............................. 257/197, 205, 257/273, 351, 362, 370, 378, 423, 511, 517, 525, 526, 565, 47

(56) References Cited

U.S. PATENT DOCUMENTS

| | | | |
|---|---|---|---|
| 5,061,644 A | 10/1991 | Yue et al. | 148/124 |
| 5,086,016 A | 2/1992 | Brodsky et al. | 148/34 |
| 6,001,701 A | 12/1999 | Carroll et al. | 148/10 |
| 6,124,180 A | 9/2000 | Chambers et al. | 148/10 |
| 6,271,577 B1 * | 8/2001 | Havemann | 257/592 |
| 2001/0013635 A1 * | 8/2001 | Kitahata | 257/565 |

* cited by examiner

Primary Examiner—Minhloan Tran
Assistant Examiner—Tan Tran
(74) Attorney, Agent, or Firm—Stallman & Pollock LLP

(57) ABSTRACT

A bipolar transistor structure includes trench isolation dielectric material formed in a semiconductor substrate to define a substrate active device region. A collector region is formed beneath the surface of the active device region. A base region is formed in the active device region above the collector region and extends to the surface of the active device region. A layer of dielectric material is formed to extend at least partially over the trench isolation and over the surface of the base region. A layer of doped polysilicon is formed over the layer of dielectric material and extends over the edge of the layer of dielectric material and over the surface of the base region. The doped polysilicon is patterned to define a polysilicon emitter region that extends over the edge of the layer of dielectric material to provide an ultra-small emitter contact on the surface of the base region. Heating of the doped polysilicon causes dopant to diffuse into the polysilicon emitter contact through the surface of the base region beneath the polysilicon emitter contact. Dielectric sidewall spacers are formed on the sidewalls of the polysilicon emitter region to electrically isolate the polysilicon emitter sidewalls.

2 Claims, 3 Drawing Sheets

BIPOLAR TRANSISTOR STRUCTURE WITH ULTRA SMALL POLYSILICON EMITTER

This application is a division of U.S. application Ser. No. 09/881,904, filed Jun. 15, 2001 now U.S. Pat. No. 6,399,455.

BACKGROUND OF THE INVENTION

1. Field of the Invention

The present invention relates to the fabrication of integrated circuit structures and, in particular, to the fabrication of an ultra-small, sub-lithographic bipolar transistor emitter using conventional lithography techniques.

2. Discussion of the Related Art

A bipolar transistor is a three-terminal device that can, when properly biased, controllably vary the magnitude of the current that flows between two of the transistor's terminals. The three terminals include a base terminal, a collector terminal and an emitter terminal. The charge carriers, which form the current, flow between the collector terminal and the emitter terminal; variations in the voltage applied to the base terminal cause the magnitude of the current to vary.

Due to the increasing demand for battery-powered devices, there is a need for a bipolar transistor that utilizes less power. Lower power consumption can be obtained in a bipolar transistor by reducing the maximum current that can flow between the collector and emitter terminals. One approach for reducing the maximum current is to reduce the size of the base-to-emitter junction, preferably to sub-lithographic feature sizes.

The literature reports a method that allows the formation of polysilicon ridge emitter transistors down to 0.1 micron width without relying on advanced lithography tools. See "Poly Emitter Transistor (PRET): Simple Low Power Option to a Bipolar Process", by Wim van der Wel, et al., IEDM 93-453, 1993, pp. 17.6.1–17.6.4. However, this method utilizes two polysilicon layers, as shown in the FIG. 1A–1C fabrication sequence.

As shown in FIG. 1A, the van der Wel et al. technique begins in the conventional manner with an integrated circuit structure that includes a trench isolation structure 100 formed in a semiconductor substrate to define a substrate active device region 102. An n-type collector region 104 is formed in the substrate active device region 102 and a p-type base region 106 is formed above the collector region 104. A layer of silicon dioxide 108 is formed to extend over the active device region 102. A first layer of n-doped polysilicon is then formed over the layer of dielectric material 108. The polysilicon layer and the underlying silicon dioxide 108 are then patterned to define a poly1 emitter region 110 that extends over the p-type base region 106 but is separated from the base region 106 by intervening dielectric material 108. A second layer of n-doped polysilicon is then formed over the above-described structure, as further shown in FIG. 1A.

As shown in FIG. 1B, the poly2 layer is then anisotropically etched to define poly2 sidewalls 112 on the poly1 emitter region 110. An subsequent annealing step results in diffusion of n-type dopant from the poly2 sidewall formed on the base region 106 into the p-type base region 106 to define an n-type emitter junction 114 in the base region 106. Dielectric sidewalls 116 are then formed to electrically isolate the poly2 sidewalls. Finally, salicide films 118 are formed on the base region 106 and on the poly1 emitter region 110, as shown in FIG. 1C.

Although the van der Wel technique described above results in small emitters, it has the following disadvantages. First, the slope of the poly1 emitter region is critical to success of this method; the slope could affect the width of the emitter (i.e. the poly2 sidewalls) significantly, introduce large variability in the emitter width across the wafer and, therefore, result in performance variability. Second, the possible large variability of the poly emitter ridge, i.e. the poly2, could in turn introduce large variability in the oxide spacers, which could cause shorts between the emitter and the base regions during the salicidation step. Third, emitter n-type dopant diffusion is less in the structure, compared to conventional single poly device architectures, due to the possible presence of a poly1/poly2 interfacial barrier in the emitter structure, as shown in FIG. 1C.

Thus, there is a need for a low-power bipolar transistor with a sub-lithographic base-to-emitter junction that reduces, or preferably eliminates, the previously-described drawbacks.

SUMMARY OF THE INVENTION

The present invention provides a bipolar transistor structure with an ultra-small polysilicon emitter and a method of fabricating the structure. The bipolar transistor structure includes trench isolation formed in a semiconductor substrate to define a substrate active device region. A collector region having a first conductivity type is formed conventionally beneath the surface of the substrate active device region. A base region having a second conductivity type opposite the first conductivity type is formed conventionally in the substrate active device region above the collector region and extending to the surface of the substrate active device region. A layer of dielectric material is formed to extend at least partially over the surface of the base region. A layer of polysilicon, doped to the first conductivity type, is then formed over the surface of the layer of dielectric material and extending over the edge of the layer of dielectric material and over the surface of the base region. A chemical mechanical polishing step is then performed to planarize the layer of doped polysilicon. The layer of doped polysilicon is then patterned to define a polysilicon emitter region that extends over the edge of the layer of dielectric material to provide an ultra-small, sub 0.2 micron, polysilicon emitter contact on the surface of the base region. The polysilicon emitter region is then heated such that dopant diffuses from the polysilicon emitter contact through the surface of the base region to form an emitter junction region having the first conductivity type at the surface of the base region beneath the polysilicon emitter contact. Dielectric sidewall spacers are then formed on the sidewalls of the polysilicon emitter region to electrically isolate the polysilicon emitter sidewalls.

A better understanding of the features and advantages of the present invention will be obtained by reference to the following detailed description and accompanying drawings that set forth an illustrative embodiment in which the principles of the invention are utilized.

DETAILED DESCRIPTION OF THE INVENTION

Figure 1A:
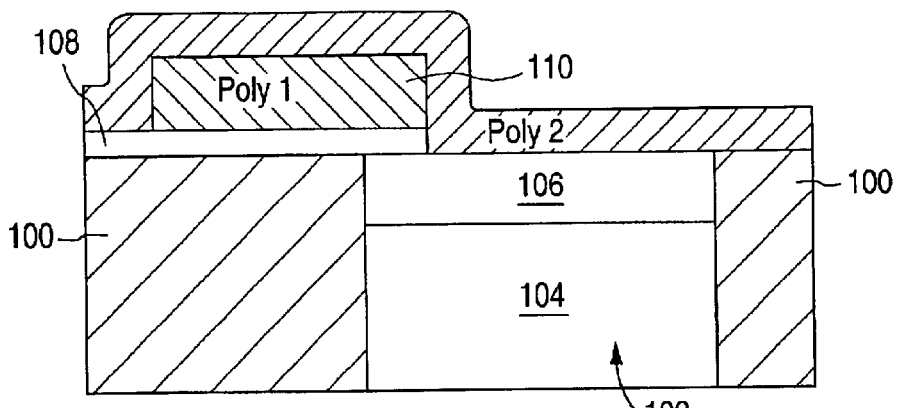
FIGS. 1A–1C are partial cross section views illustrating a sequence of steps for fabricating a poly-ridge emitter transistor in accordance with published techniques.
Figure 1B:
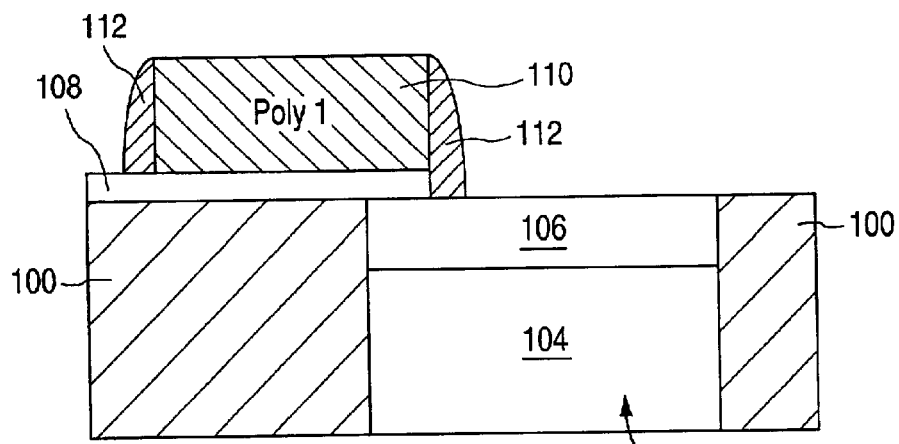
Figure 1C:
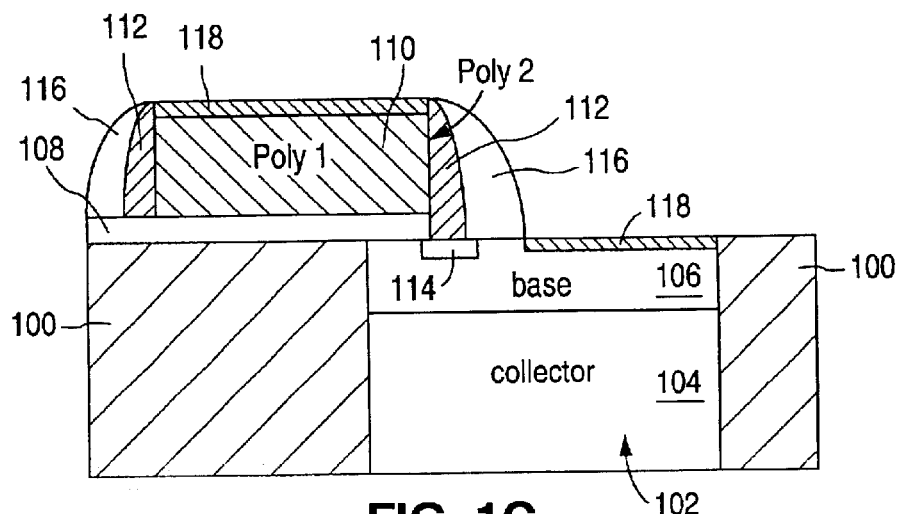
Figure 2A:
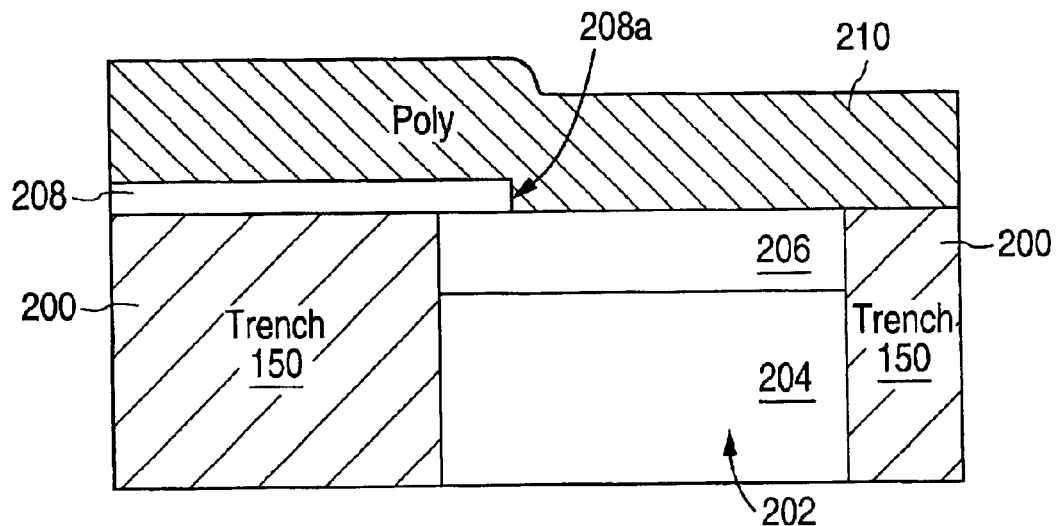
FIGS. 2A–2D are partial cross section views illustrating a sequence of steps for fabricating an ultra-small bipolar transistor emitter in accordance with the concepts of the present invention.

FIG. 2A shows a partially completed low-power bipolar transistor structure. The bipolar transistor structure is formed on a semiconductor wafer, typically silicon, that has an n+ buried layer and a lightly-doped, n-type epitaxial layer that is formed over the n+ buried layer, the n+ buried layer and the n-type epitaxial layer forming the collector 204 of the bipolar transistor, all in accordance with conventional techniques. A p-type intrinsic base region 206 is formed above the collector region 204, also in accordance with conventional techniques.

As shown in FIG. 2A, the bipolar transistor structure includes trench isolation regions 200 formed in the semiconductor substrate to define a substrate active device region 202 that includes n-type collector region 204 and p-type base region 206. A layer of dielectric material 208, preferably silicon dioxide about 1000 Angstroms thick, is formed and patterned to extend partially over the surface of the base region 206 to define an edge 208a of the layer of dielectric material 208 that is formed over the surface of the intrinsic base region 206.

A layer of polysilicon 210, about 2000 Angstroms thick, is then formed over a surface of the layer of dielectric material 208 and extending over the edge 208a of the layer of dielectric material 208 and over the surface of the base region 206, as shown in FIG. 2A. Polysilicon layer 210 is conventionally doped with phosphorous or arsenic, e.g. by ion implantation, to have a high n+ dopant concentration.

Figure 2B:
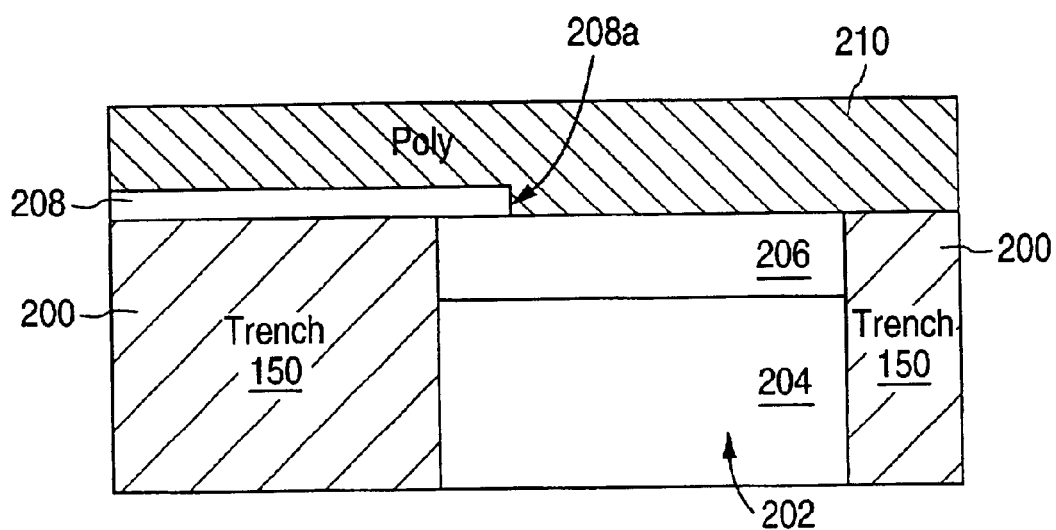

Referring to FIG. 2B, in accordance with the concepts of the invention, a chemical mechanical polishing (CMP) step is then performed to planarize the layer of n-doped polysilicon 210.

Figure 2C:
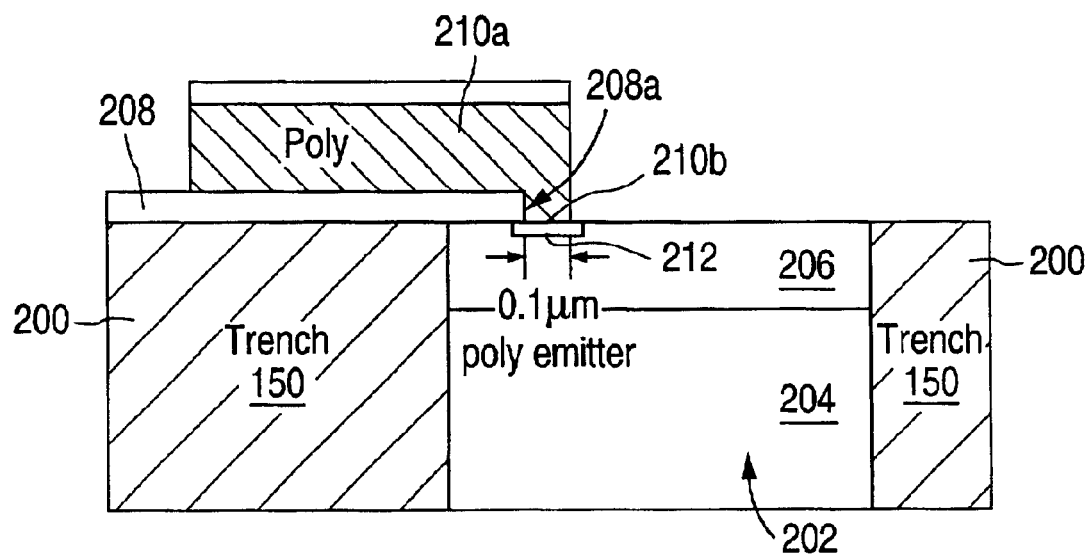

Referring to FIG. 2C, the layer of n-doped polysilicon 210 is then masked and patterned, using conventional photolithographic techniques, to define a polysilicon emitter region 210a that extends over the edge 208a of the layer of dielectric material 208 to provide a polysilicon emitter contact 210b on the surface of the base region 206. The structure is then heated such that n-type dopant contained in the polysilicon emitter region 210a diffuses through the surface of the p-type intrinsic base region 206 to define an n-type emitter junction region 212 at the surface of the base region 206 beneath the polysilicon emitter contact 210b, as shown in FIG. 2C.

Figure 2D:
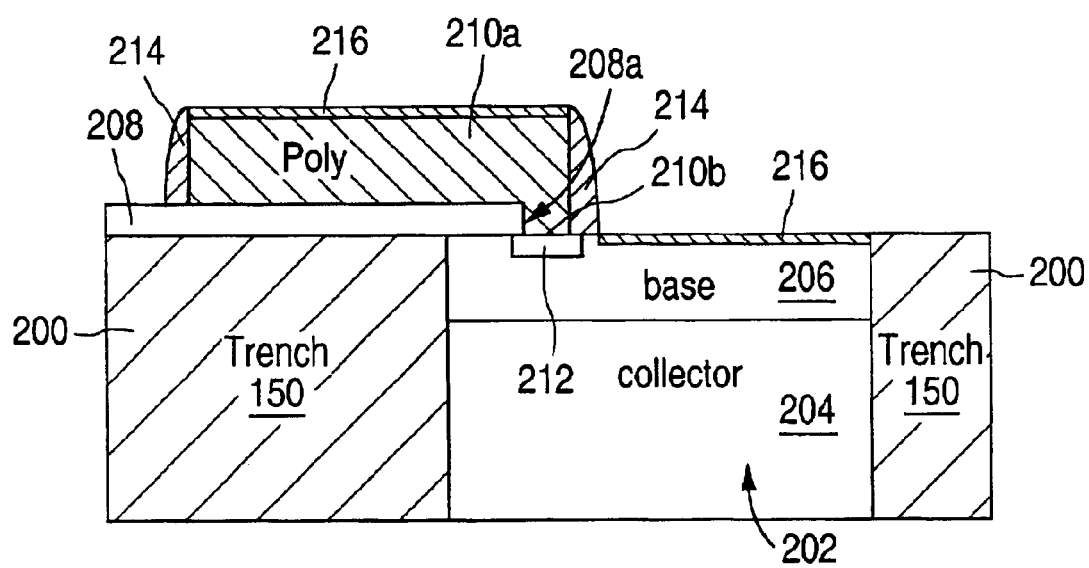

Next, a layer of dielectric material, preferably silicon dioxide, is then formed over the foregoing structure and anisotropically etched to define dielectric sidewall spacers 214 on sidewalls of the polysilicon emitter region 210a, as shown in FIG. 2D.

Following sidewall oxide spacer formation, the rest of the fabrication process continues in the conventional manner with contact implants and anneal, and formation of salicide 216 on the emitter 210a and base regions 206, resulting in the structure shown in FIG. 2D.

Thus, in accordance with the present invention a sub-lithography emitter dimension can be patterned conventionally using a masking step in such a way to form an emitter width that is smaller than the capability of the lithographic technique itself. The conventional masking and patterning of the emitter polysilicon results in a reproducible vertical polysilicon emitter sidewall; as discussed above, this is important in order to minimize the variability of the emitter width. The formation of a vertical polysilicon emitter sidewall results in a full height and width sidewall oxide spacer which, in turn, significantly reduces the possibility of shorts between the emitter polysilicon and the base areas during salicidation. The present technique also saves one polysilicon layer, but requires a chemical mechanical polishing step to level out the emitter poly surface and a masking step to pattern the emitter poly. However, these additional steps are conventional processing steps.

It should be understood that various alternatives to the embodiments of the invention described above may be employed in practicing the invention. For example, although the invention is described above with respect to npn transistors, the method applies equally well to pnp transistors. In addition, the above-described inventive techniques can be incorporated into a BiCMOS process. Thus, it is intended that the following claims define the scope of the invention and that structures and methods within the scope of these claims and their equivalents be covered thereby

What is claimed is:

1. A bipolar transistor structure comprising:

a dielectric trench isolation structure formed in a semiconductor substrate to define a substrate active device region;

a collector region having a first conductivity type formed in the substrate active device region beneath a surface thereof;

a base region having a second conductivity type that is opposite the first conductivity type formed in the substrate active device region above the collector region and extending to the surface of the substrate active device region such that the surface of the substrate active device region forms a surface of the base region;

a layer of dielectric material formed directly on the dielectric trench isolation structure and directly on a part of the surface of the base region to define an edge of the layer of dielectric material that is formed directly on the surface of the base region;

a discrete layer of polysilicon that is doped to the first conductivity type and that is formed directly on the layer of dielectric material and directly on the layer of dielectric material such that a first region of the discrete layer of polysilicon overlies the dielectric trench isolation structure and a second region of the discrete layer of polysilicon extends beyond the edge of the layer of dielectric material and into direct contact with the surface of the base region to provide a polysilicon emitter contact region on the surface of the base region; and an emitter junction region having the first conductivity type formed in the base region beneath and in electrical contact with the polysilicon emitter contact region.

2. A bipolar transistor structure as in claim 1, and wherein the second region of the discrete layer of polysilicon that forms the polysilicon emitter contact region is less than 0.2 microns wide.

* * * * *